United States Patent
Osawa et al.

(10) Patent No.: US 10,700,697 B2
(45) Date of Patent: Jun. 30, 2020

(54) AD CONVERTER AND IMAGE SENSOR

(71) Applicant: OLYMPUS CORPORATION, Hachioji-shi, Tokyo (JP)

(72) Inventors: Masato Osawa, Tokyo (JP); Yasunari Harada, Ebina (JP); Shuzo Hiraide, Tokyo (JP); Hideki Kato, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 56 days.

(21) Appl. No.: 15/998,842

(22) Filed: Aug. 17, 2018

(65) Prior Publication Data

US 2018/0367160 A1 Dec. 20, 2018

Related U.S. Application Data

(63) Continuation of application No. PCT/JP2016/057961, filed on Mar. 14, 2016.

(51) Int. Cl.
*H04N 5/374* (2011.01)
*H03M 1/46* (2006.01)
(Continued)

(52) U.S. Cl.
CPC ............ *H03M 1/466* (2013.01); *H04N 5/378* (2013.01); *H04N 5/3742* (2013.01);
(Continued)

(58) Field of Classification Search
CPC ...... H03M 1/466; H03M 1/123; H03M 1/468; H04N 5/3742; H04N 5/378; H04N 5/37455; H04N 9/0455
See application file for complete search history.

(56) References Cited

U.S. PATENT DOCUMENTS 8,884,801 B1 11/2014 Ranjbar
2005/0200510 A1 9/2005 Yoshida et al.
(Continued)

FOREIGN PATENT DOCUMENTS

JP 61-126823 A 6/1986
JP 5-196417 A 8/1993
(Continued)

OTHER PUBLICATIONS

International Search Report dated Jun. 7, 2016, issued in counterpart International Application No. PCT/JP2016/057961, w/English translation (2 pages).

(Continued)

*Primary Examiner* — Twyler L Haskins
*Assistant Examiner* — Angel L Garces-Rivera
(74) *Attorney, Agent, or Firm* — Westerman, Hattori, Daniels & Adrian, LLP

(57) ABSTRACT

In an AD converter, a first DAC circuit performs a first operation in parallel with a second operation performed by a second DAC circuit, and the first DAC circuit performs the second operation in parallel with the first operation performed by the second DAC circuit. In the first operation, electric charge corresponding to an input signal of the first DAC circuit or an input signal of the second DAC circuit is sampled. In the second operation, an AD conversion is sequentially performed on the basis of the electric charge sampled in the first operation. The first DAC circuit and the second DAC circuit alternately perform the first operation and the second operation.

3 Claims, 8 Drawing Sheets

(51) Int. Cl.
*H04N 9/04* (2006.01)
*H04N 5/3745* (2011.01)
*H04N 5/378* (2011.01)
*H03M 1/12* (2006.01)

(52) U.S. Cl.
CPC ....... *H04N 5/37455* (2013.01); *H04N 9/0455* (2018.08); *H03M 1/123* (2013.01); *H03M 1/468* (2013.01)

(56) References Cited

U.S. PATENT DOCUMENTS

| | | | |
|---|---|---|---|
| 2009/0109315 A1* | 4/2009 | Taura | H04N 5/378 348/311 |
| 2010/0151900 A1* | 6/2010 | Koli | G11C 27/024 455/550.1 |
| 2011/0241912 A1 | 10/2011 | Doris et al. | |

FOREIGN PATENT DOCUMENTS

| | | |
|---|---|---|
| JP | 6-505836 A | 6/1994 |
| JP | 10-285037 A | 10/1998 |
| JP | 2005-223888 A | 8/2005 |
| JP | 2010-283773 A | 12/2010 |
| JP | 2011-188240 A | 9/2011 |
| JP | 2014-22763 A | 2/2014 |
| JP | 2014-513496 A | 5/2014 |
| WO | 92/04777 A1 | 3/1992 |
| WO | 2012/151491 A2 | 11/2012 |

OTHER PUBLICATIONS

Notice of Allowance dated Jan. 7, 2020, issued in counterpart JP Application No. 2018-505067, with English translation (6 pages).

* cited by examiner

AD CONVERTER AND IMAGE SENSOR

The present application is a continuation application based on International Patent Application No. PCT/JP2016/057961 filed on Mar. 14, 2016, the content of which is incorporated herein by reference.

BACKGROUND OF THE INVENTION

Field of the Invention

The present invention relates to an analog-to digital (AD) converter and an image sensor.

Description of Related Art

For example, a successive approximation AD converter according to a conventional technology is disclosed in Japanese Unexamined Patent Application, First Publication No. S61-126823. In this successive approximation AD converter, an analog input signal is sampled and is stored in a capacitor. An AD conversion is performed for one bit each time on the basis of the analog input signal stored in the capacitor.

SUMMARY OF THE INVENTION

According to a first aspect of the present invention, an AD converter includes a first DAC circuit, a second DAC circuit, a comparison circuit, and a control circuit. The first DAC circuit includes a plurality of first capacitors of which capacitance values are weighted. The second DAC circuit includes a plurality of second capacitors of which capacitance values are weighted. The comparison circuit is connected to a first output node of the first DAC circuit and a second output node of the second DAC circuit and compares an electric potential of the first output node with an electric potential of the second output node. The control circuit controls the first DAC circuit and the second DAC circuit in accordance with a result of the comparison acquired by the comparison circuit. The first DAC circuit and the second DAC circuit are configured to perform a first operation and a second operation. The first DAC circuit performs the first operation in parallel with the second operation performed by the second DAC circuit, and the first DAC circuit performs the second operation in parallel with the first operation performed by the second DAC circuit. Electric charge corresponding to an input signal of the first DAC circuit or the second DAC circuit is sampled in each first capacitor included in the plurality of first capacitors or each second capacitor included in the plurality of second capacitors in the first operation. An AD conversion is sequentially performed in the second operation on the basis of the electric charge sampled in each first capacitor included in the plurality of first capacitors or each second capacitor included in the plurality of second capacitors in the first operation. The first DAC circuit and the second DAC circuit alternately perform the first operation and the second operation.

According to a second aspect of the present invention, in the first operation of the first aspect, the input signal may be applied to a first input node of the first DAC circuit. A first reference signal may be applied to the first output node in the first operation. In the first operation, first electric charge may be stored in the plurality of first capacitors. The first electric charge may be conserved on the basis of a difference between an electric potential of the input signal and an electric potential of the first reference signal. The electric potential of the first reference signal applied to the first output node may be input to the comparison circuit as a first electric potential in the first operation. In the second operation, when a second reference signal is applied to the first input node and the first electric charge is conserved, signals input to input nodes of the plurality of first capacitors may be switched to the second reference signal or a ground level by the control circuit, and a second electric potential may be generated. The second electric potential may be input to the comparison circuit in the second operation. The comparison circuit may compare the first electric potential with the second electric potential. The control circuit may control a DAC circuit performing the second operation out of the first DAC circuit and the second DAC circuit on the basis of a result of the comparison.

According to a third aspect of the present invention, in the first operation of the first aspect, the input signal may be applied to a second input node of the second DAC circuit. A first reference signal may be applied to the second output node in the first operation. In the first operation, second electric charge may be stored in the plurality of second capacitors. The second electric charge may be conserved on the basis of a difference between an electric potential of the input signal and an electric potential of the first reference signal. The electric potential of the first reference signal applied to the second output node may be input to the comparison circuit as a first electric potential in the first operation. In the second operation, when a second reference signal is applied to the second input node and the second electric charge is conserved, signals input to input nodes of the plurality of second capacitors may be switched to the second reference signal or a ground level by the control circuit and a third electric potential may be generated. The third electric potential may be input to the comparison circuit in the second operation. The comparison circuit may compare the first electric potential with the third electric potential. The control circuit may control a DAC circuit performing the second operation out of the first DAC circuit and the second DAC circuit on the basis of a result of the comparison.

According to a fourth aspect of the present invention, an image sensor includes the AD converter according to the first to third aspects, a plurality of pixels, and a plurality of column circuits. The plurality of pixels are disposed in a matrix pattern. Each column circuit included in the plurality of column circuits are disposed for each column of the plurality of pixels. Signals output from the column circuits disposed in odd-numbered columns of the plurality of pixels are input to one of the first DAC circuit and the second DAC circuit. Signals output from the column circuits disposed in even-numbered columns of the plurality of pixels are input to a DAC circuit other than the DAC circuit to which the signals output from the column circuits disposed in the even-numbered columns are input.

According to a fifth aspect of the present invention, an image sensor includes the AD converter according to the first to third aspects and a plurality of pixels. The plurality of pixels are disposed in a matrix pattern. The plurality of pixels include a plurality of first pixels and a plurality of second pixels. Each first pixel included in the plurality of first pixels includes a color filter of a first color. Each second pixel included in the plurality of second pixels includes a color filter of a second color different from the first color. The plurality of first pixels and the plurality of second pixels are periodically arranged. Signals output from the first pixels are input to one of the first DAC circuit and the second DAC circuit. Signals output from the second pixels are input to a DAC circuit other than the DAC circuit to which the signals output from the first pixels are input.

DETAILED DESCRIPTION OF THE INVENTION

Embodiments of the present invention will be described with reference to the drawings.

First Embodiment

Figure 1:
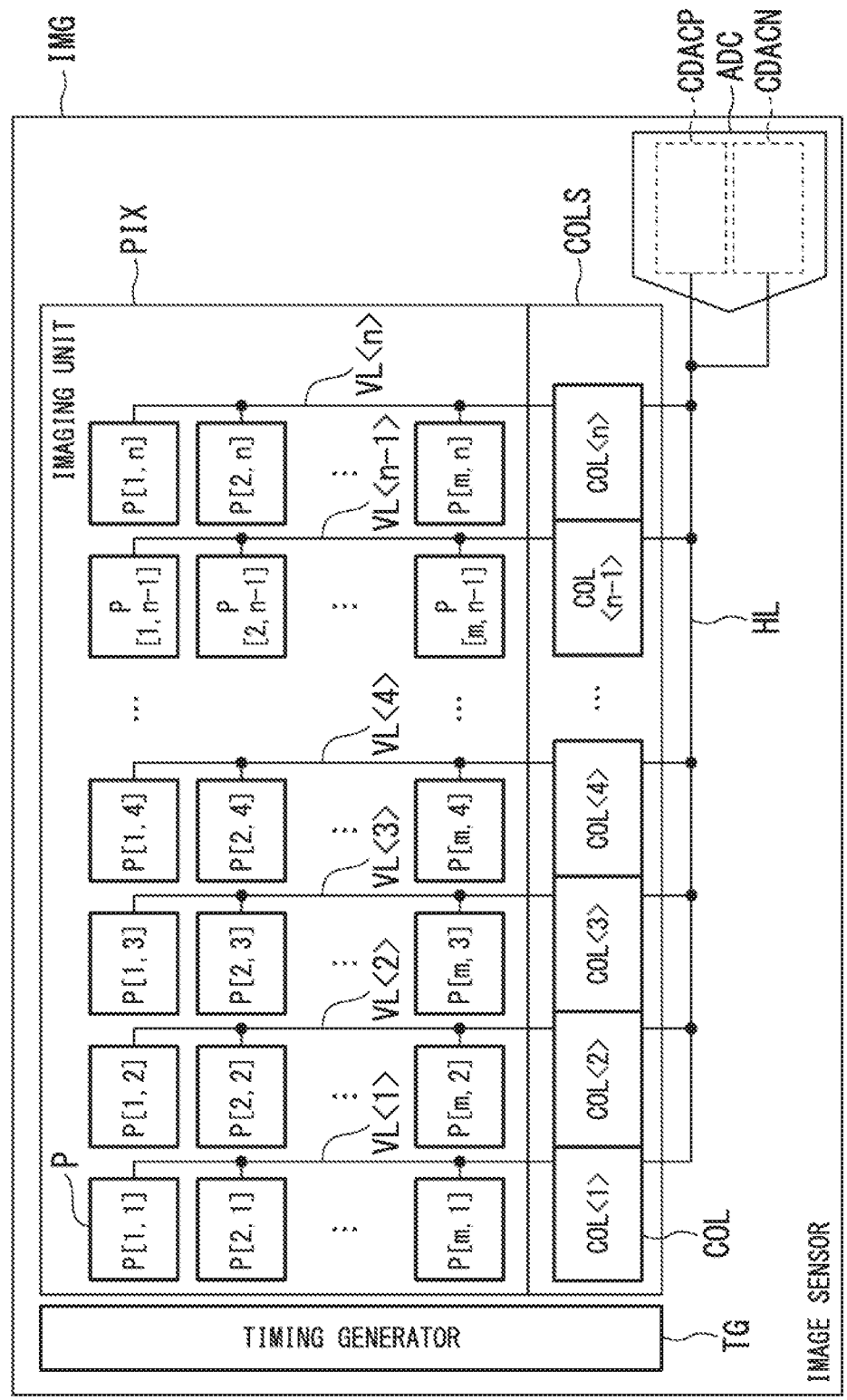
FIG. 1 is a block diagram showing the entire configuration of an image sensor according to a first embodiment of the present invention.

The entire configuration of an image sensor IMG according to a first embodiment of the present invention will be described with reference to FIG. 1. FIG. 1 shows the entire configuration of the image sensor IMG. As shown in FIG. 1, the image sensor IMG includes an imaging unit PIX, a timing generator TG, a column processing unit COLS, and an AD converter ADC.

The imaging unit PIX includes a plurality of pixels P disposed in a matrix pattern. In FIG. 1, some of the plurality of pixels P are not shown. In a case in which a pixel P needs to be distinguished from the others, the pixel P is represented using a row number m and a column number n. Here, m is an arbitrary integer of one or more, and n is an arbitrary integer of two or more. A pixel P disposed in the i-th row and the j-th column is a pixel P[i, j]. Here, i is an integer that is one or more and m or less. In addition, j is an integer that is one or more and n or less. The imaging unit PIX includes m×n pixels P[1, 1] to P[m, n]. In addition, n vertical signal lines VL<1> to VL<n> are disposed in a column direction. The pixels P[1, 1] to P[m, n] are connected to the vertical signal lines VL<1> to VL<n> for each column. In other words, the pixels P[1, j] to P[m, j] of the j-th column are connected to the vertical signal line VL<j>. Each pixel P outputs a reset signal at the time of resetting the pixel P and a video signal corresponding to light incident on the pixel P to the column processing unit COLS. The pixel P includes a photodiode and accumulates a signal corresponding to light incident on the pixel P in the photodiode. The pixel P outputs a video signal based on the signal accumulated in the photodiode to the column processing unit COLS.

The column processing unit COLS includes a plurality of column circuits COL disposed for each column of a plurality of pixels P. In FIG. 1, some of the plurality of column circuits COL are not shown. In a case in which a column circuit COL needs to be distinguished from the others, the column circuit COL is represented using a column number n. A column circuit COL disposed in the j-th column is a column circuit COL<j>. The column processing unit COLS includes n column circuits COL<1> to COL<n>. The column circuits COL<1> to COL<n> are respectively disposed for the vertical signal lines VL<1> to VL<n>. The column circuit COL<j> of the j-th column is connected to the vertical signal line VL<j>. Reset signals and video signals output from the pixels P[1, j] to P[m, j] of the j-th column are input to the column circuit COL<j> of the j-th column. The column circuits COL<1> to COL<n> are connected to the AD converter ADC through a horizontal signal line HL. The column circuits COL<1> to COL<n> cancel reset noises and the like included in the video signals output from the pixels P[1, 1] to P[m, n]. Accordingly, the column circuits COL<1> to COL<n> generate video signals VSIG and output the video signals VSIG to the AD converter ADC.

The AD converter ADC is connected to the horizontal signal line HL. The AD converter ADC converts video signals VSIG (analog signals) output from the column circuits COL<1> to COL<n> into digital signals. The AD converter ADC includes a digital-to-analog converter (DAC) circuit CDACP and a DAC circuit CDACN in an input stage.

The timing generator TG is connected to the imaging unit PIX, the column processing unit COLS, and the AD converter ADC by signal lines that are not shown in the drawing. The timing generator TG supplies a signal necessary for controlling the image sensor IMG to each unit.

The timing generator TG supplies a row selection signal RSEL<1> to a pixel P[1, 1] to a pixel P[1, n] of the first row and supplies a row selection signal RSEL<m> to a pixel P[m, 1] to a pixel P[m, n] of the m-th row. The timing generator TG also supplies similar signals to pixels P of the other rows. In a case in which a row selection signal RSEL<i> is "L (low)," a pixel P[i, 1] to a pixel P[i, n] to which a row selection signal RSEL<i> is supplied are not connected to vertical signal lines VL<1> to VL<n>. On the other hand, in a case in which the row selection signal RSEL<i> is "H (high)," the pixel P[i, 1] to the pixel P[i, n] to which the row selection signal RSEL<i> is supplied are connected to the vertical signal lines VL<1> to VL<n>.

The timing generator TG supplies a control signal CLP_R and a control signal CLP_S to the column circuits COL<1> to COL<n>. The control signal CLP_R is a control signal used for the column circuits COL<1> to COL<n> to sample a reset signal output from a pixel P. At a timing at which a reset signal is output from the pixel P, the control signal CLP_R changes to "H." At this time, the column circuits COL<1> to COL<n> sample the reset signal. When the control signal CLP_R changes to "L," the sampling operation ends.

The control signal CLP_S is a control signal used for the column circuits COL<1> to COL<n> to sample a video signal output from a pixel P. At a timing at which the video signal is output from the pixel P, the control signal CLP_S changes to "H." At this time, the column circuits COL<1> to COL<n> sample a video signal. When the control signal CLP_S changes to "L," the sampling operation ends.

The timing generator TG respectively supplies column selection signals CSEL<1> to CSEL<n> to the column circuits COL<1> to COL<n>. When the column selection signals CSEL<1> to CSEL<n> change to "H," the column circuits COL<1> to COL<n> are connected to the horizontal signal line HL. At this time, each of the column circuits COL<1> to COL<n> outputs a video signal VSIG<x> based on a difference VPLX<x> between a reset signal and a video signal to the AD converter ADC. Here, x is an integer that is "1" or more and "n" or less. The video signal VSIG<x> is a signal a reference of which is the electric potential of a reference signal VREF.

The video signal VSIG is represented using Equation (1). The video signal VSIG has a negative polarity.

$$VSIG = VREF - VPLX<x> \quad (1)$$

For example, in a case in which a signal supplied from a pixel P is at a minimum level (black level), the video signal VSIG is represented using Equation (2). On the other hand, in a case in which a signal supplied from the pixel P is at a maximum level (saturated level), the video signal VSIG is represented using Equation (3). In Equation (3), VPIX_SAT is a saturated (maximum) voltage of VPIX.

$$VSIG = VREF - 0 \quad (2)$$

$$VSIG = VREF - VPLX\_SAT \quad (3)$$

In the example described above, the video signal VSIG has a negative polarity. However, the video signal VSIG may have a positive polarity.

Figure 2:
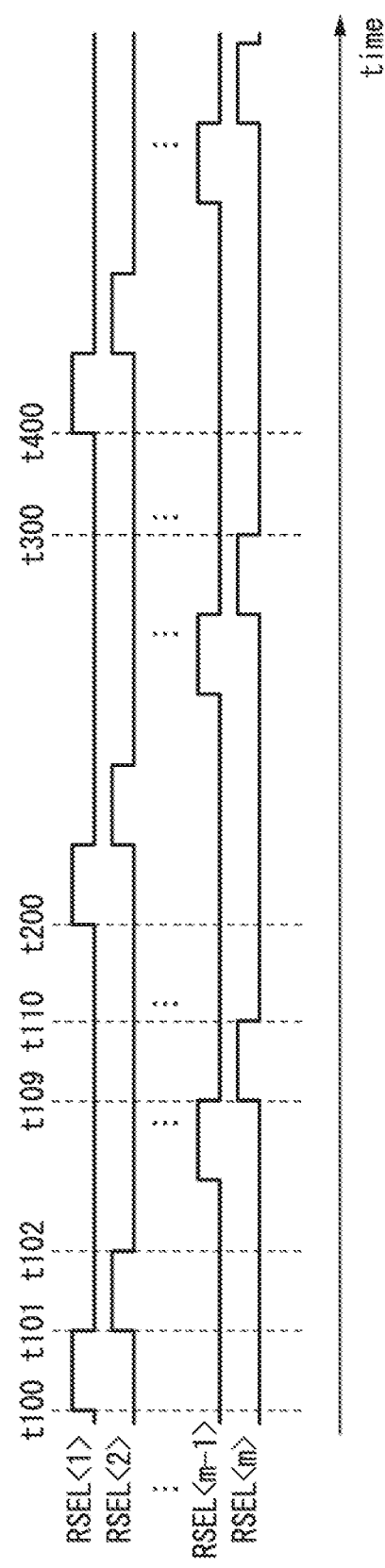
FIG. 2 is a timing diagram showing the operation of the image sensor according to the first embodiment of the present invention.
Figure 3:
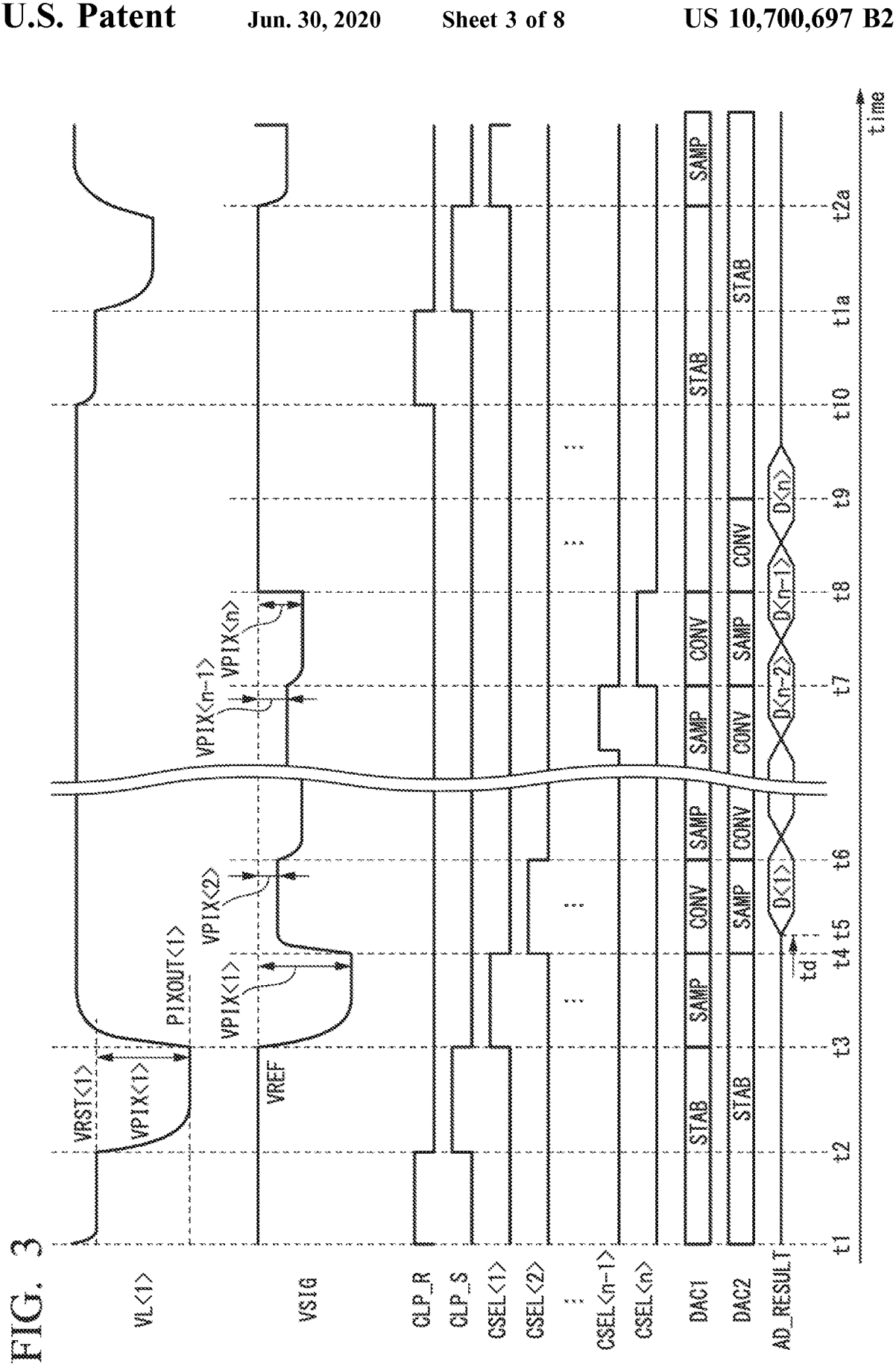
FIG. 3 is a timing diagram showing the operation of the image sensor according to the first embodiment of the present invention.

A signal reading operation performed by the image sensor IMG will be described in more detail with reference to FIGS. 2 and 3. FIGS. 2 and 3 show signals relating to the operation of the image sensor IMG. In FIG. 2, row selection signals RSEL<1> to RSEL<m> are shown. In FIG. 3, the electric potential of a vertical signal line VL<1>, a video signal VSIG a control signal CLP_R, a control signal CLP_S, and column selection signals CSEL<1> to CSEL<n> are shown. In FIG. 3, a state of a DAC circuit CDACP (DAC1), a state of a DAC circuit CDACN (DAC2), and a bit stream D<1> to D<n> of an AD conversion result (AD_RESULT) are shown. In FIGS. 2 and 3, the horizontal axis represents time, and the vertical axis represents a signal level. The resolution in the time direction is different between FIGS. 2 and 3. In FIG. 2, a period of a time t100 to a time t101 corresponds to a period of times t1 to t10 shown in FIG. 3.

At the time t100, the row selection signal RSEL<1> changes to "H." The row selection signals RSEL<2> to RSEL<m> are maintained at "L." At a time t101, the row selection signal RSEL<1> changes to "L," and the row selection signal RSEL<2> changes to "H." Thereafter, row selection signals RSEL<3> to RSEL<m> of each row sequentially change to "H." At a time t109, a row selection signal RSEL<m−1> changes to "L," and a row selection signal RSEL<m> changes to "H." At a time t110, the row selection signal RSEL<n> changes to "L." Changes in the row selection signals RSEL<1> to RSEL<n> from a time t200 to a time t300 are similar to the changes in the row selection signals RSEL<1> to RSEL<m> from the time t100 to the time t110.

Before signals supplied from the pixels P[1, 1] to P[1, n] of the first row are read at a time t1 shown in FIG. 3, the photodiodes of the pixels P[1, 1] to P[1, n] are reset to a predetermined voltage and are exposed for a predetermined time. Hereinafter, the description will focus on reading of signals supplied from the pixels P[1, 1] to P[1, n] of the first row. Reading of signals supplied from pixels P of the other rows is similar to the reading of the signals supplied from the pixels P of the first row. At a time t1, the DAC circuit CDACP and the DAC circuit CDACN are in a stopped state STAB.

At the time t1, the row selection signal RSEL<1> becomes "H," and the pixels P[1, 1] to P[1, n] of the first row are respectively connected to the vertical signal lines VL<1> to VL<n>. At this timing, the pixels P[1, 1] to P[1, n] respectively start to output reset signals VRST<1> to VRST<n>. Only a reset signal VRST<1> of the first column among the reset signals VRST<1> to VRST<n> of columns is representatively shown in FIG. 3. At this timing, the control signal CLP_R becomes "H." Accordingly, the column circuits COL<1> to COL<n> start sampling operations of the reset signals VRST<1> to VRST<n>.

After a predetermined time elapses from the time t1, and the reset signals VRST<1> to VRST<n> are stabilized, the control signal CLP_R becomes "L" at a time t2. Accordingly, the levels of the reset signals stored in the column circuits COL<1> to COL<n> are determined. At this timing, the pixels P[1, 1] to P[1, n] start to output video signals PLXOUT<1> to PIXOUT<n>. Simultaneously the control signal CLP_S becomes "H." Accordingly, the column circuits COL<1> to COL<n> start operations of sampling the video signals PIXOUT<1> to PIXOUT<n>.

At a time t3, the control signal CLP_S becomes "L," and thus the column circuits COL<1> to COL<n> end the operations of sampling the video signals PIXOUT<1> to PIXOUT<n>. Inside the column circuits COL<1> to COL<n>, reset noises of pixels and the like included in the video signals PIXOUT<1> to PIXOUT<n> input from the pixels P[1, 1] to P[1, n] are cancelled. The column circuits COL<1> to COL<n> store video signals VSIG having amplitudes of VPIX<1> to VPIX<n> a reference of which is the electric potential of the reference signal VREF.

At the time t3, the column selection signal CSEL<1> becomes "H," and thus a video signal VSIG having an amplitude VPIX<1> is output from the column circuit COL<1> of the first column. This signal is sampled by the DAC circuit CDACP of the AD converter ADC. At this time, the DAC circuit CDACP starts a sampling operation SAMP.

At a time t4, the column selection signal CSEL<1> becomes "L," and the column selection signal CSEL<2> simultaneously becomes "H." Accordingly, a video signal VSIG having an amplitude VPIX<2> is output from the column circuit COL<2> of the second column. This signal is sampled by the DAC circuit CDACN of the AD converter ADC. At this time, the DAC circuit CDACN starts a sampling operation SAMP. At the time t4, the DAC circuit CDACP ends the sampling operation SAMP and starts an AD conversion operation CONV. At a time t5 that is time when a conversion time td elapses from the time t4, the AD converter ADC updates the AD conversion result AD_RESULT and outputs a bit stream D<1> as the conversion result. In an embodiment of the present invention, the bit stream D<1> is a signal constituted by a digital signal D[6:1] to be described later.

After the time t5, similarly, the column selection signals CSEL<3> to CSEL<n> sequentially become "H," and thus video signals VSIG are sequentially output from the column circuits COL<3> to COL<n> and are input to the AD converter ADC.

The sampling operation SAMP for the video signal VSIG output from the column circuit COL<n> starts at a time t7 and ends at a time t8. The AD conversion operation CONV for the video signal VSIG output from the column circuit COL<n> starts at the time t8 and ends at a time t9.

In the operation described above, video signals VSIG output from the column circuits COL<1> to COL<n−1> of odd-numbered columns are sampled by the DAC circuit CDACP of the AD converter ADC. In addition, video signals VSIG output from the column circuits COL<2> to COL<n> of even-numbered columns are sampled by the DAC circuit CDACN of the AD converter ADC. In a period in which one DAC circuit performs the sampling operation SAMP, the other DAC circuit performs the AD conversion operation CONV. The sampling operation SAMP using one capacitive DAC circuit and the AD conversion operation CONV using the other capacitive DAC circuit are performed in parallel with each other. In a period in which no column circuit is selected, the DAC circuit of the AD converter ADC is in a stopped state STAB.

At a moment at which each of the column selection signals CSEL<1> to CSEL<n> is switched from "H" to "L," the AD converter ADC ends the sampling of the video signals VSIG output from the column circuit COL<i> of a column corresponding to the column selection signal CSEL<i> and starts an AD conversion. When the AD conversion ends, the AD converter ADC updates the bit stream D<1> to D<n> and sequentially outputs (updates) the AD conversion result AD_RESULT.

At the time t101 (corresponding to the time t10) after the end of reading from a pixel P[1, n] of the first row and the n-th column, the row selection signal RSEL<1> is switched from "H" to "L." Simultaneously, the row selection signal RSEL<2> is switched from "L" to "H." Thereafter, signals supplied from pixels P that are the pixel P[2, 1] of the second row and the first column to the pixel P[2, n] of the second row and the n-th column are read through the column circuits COL<1> to COL<n>. Thereafter, similarly, signals supplied from pixels P of the third row to the m-th row are read, and the reading ends at a time t300. After the reading ends, exposure of each pixel P is performed again. After the exposure ends, at a time t400, the row selection signal RSEL<1> is switched from "L" to "H," and thus reading from the pixels P[1, 1] to P[1, n] of the first row is started again.

As described above, the image sensor IMG includes at least an AD converter ADC, a plurality of pixels P, and a plurality of column circuits COL. The plurality of pixels P are disposed in a matrix pattern. Each column circuit COL included in the plurality of column circuits COL is disposed for each column of the plurality of pixels P. Video signals VSIGp are input to one of the DAC circuit CDACP and the DAC circuit CDACN, specifically DAC circuit CDACP. Video signals VSIGp correspond to the video signals VSIG output from the column circuits COL<1> to COL<n−1> disposed in odd-numbered columns of the plurality of pixels P. Video signals VSIGn are input to the DAC circuit CDACN different from the DAC circuit CDACP to which the video signals VSIGp are input. Video signals VSIGn correspond to the video signals VSIG output from the column circuits COL<2> to COL<n> disposed in even-numbered columns of the plurality of pixels P.

Figure 4:
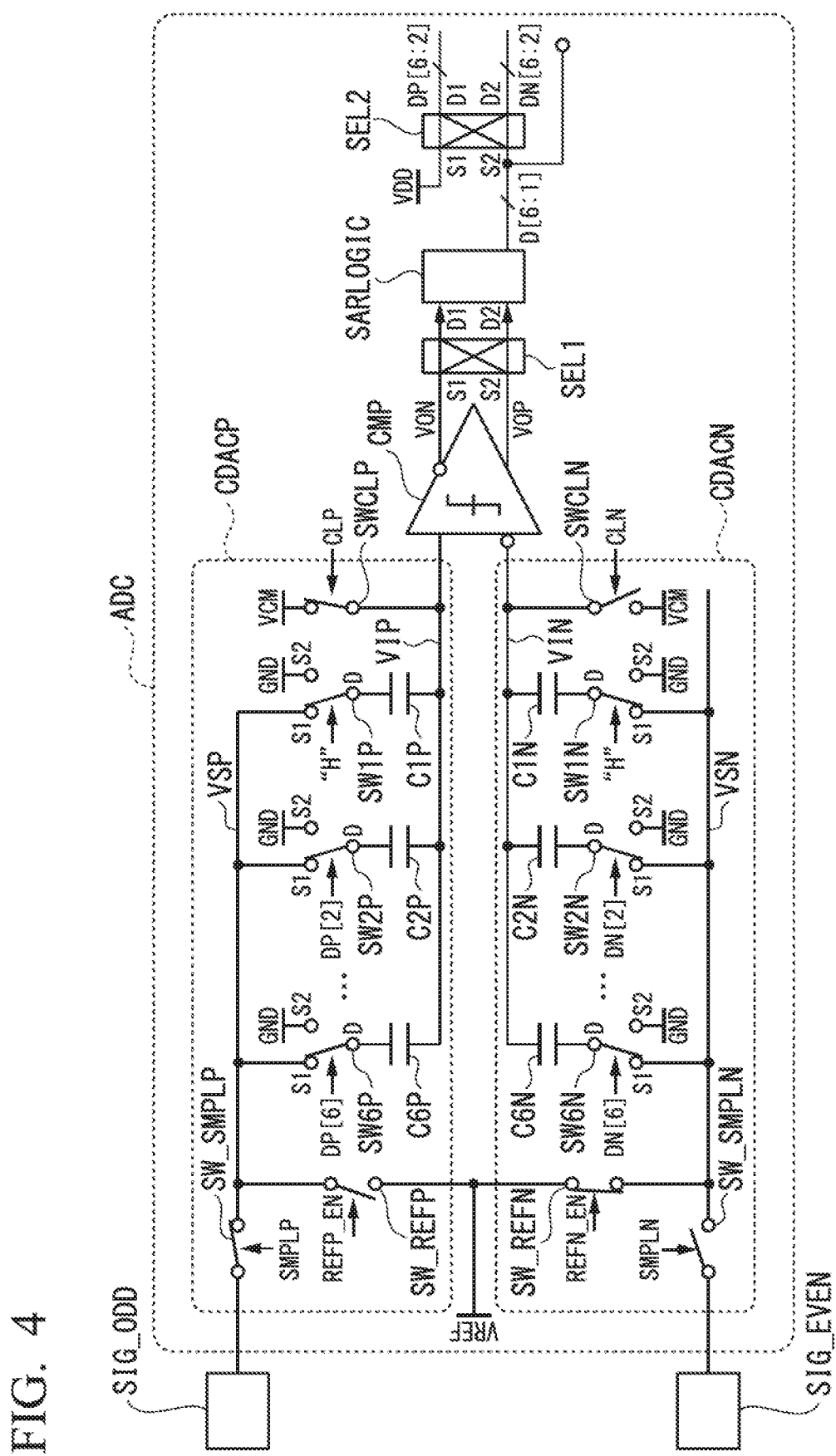
FIG. 4 is a circuit diagram showing the configuration of an AD converter according to the first embodiment of the present invention.

The configuration of the AD converter ADC will be described with reference to FIG. 4. FIG. 4 shows the configuration of the AD converter ADC.

A schematic configuration of the AD converter ADC will be described. The AD converter ADC includes at least a DAC circuit CDACP (first DAC circuit), a DAC circuit CDACN (second DAC circuit), a comparison circuit CMP, and a control circuit SARLOGIC. The DAC circuit CDACP includes a plurality of DAC capacitors C2P to C6P (first capacitors) weighted with capacitance values. The DAC circuit CDACN includes a plurality of DAC capacitors C2N to C6N (second capacitors) weighted with capacitance values. The comparison circuit CMP is connected to a node VIP (first output node) of the DAC circuit CDACP and a node VIN (second output node) of the DAC circuit CDACN and compares the electric potential of the node VIP with the electric potential of the node VIN. The control circuit SARLOGIC controls the DAC circuit CDACP and the DAC circuit CDACN in accordance with a result of the comparison acquired by the comparison circuit CMP. The DAC circuit CDACP and the DAC circuit CDACN are configured to perform a sampling operation (first operation) and an AD conversion operation (second operation). The DAC circuit CDACP performs the sampling operation (first operation) in parallel with the AD conversion operation (second operation) using the DAC circuit CDACN, and the DAC circuit CDACP performs an AD conversion operation in parallel with a sampling operation performed by the DAC circuit CDACN. In the sampling operation, electric charge corresponding to an input signal input to the DAC circuit CDACP or the DAC circuit CDACN, in other words, a video signal VSIG is sampled in each DAC capacitor included in the plurality of DAC capacitors C2P to C6P or each DAC capacitor included in the plurality of DAC capacitors C2N to C6N. In the AD conversion operation, an AD conversion is sequentially performed on the basis of the electric charge sampled in each DAC capacitor included in the plurality of DAC capacitors C2P to C6P or each DAC capacitor included in the plurality of DAC capacitors C2N to C6N in accordance with the sampling operation. Each of the DAC circuit CDACP and the DAC circuit CDACN alternately performs the sampling operation and the AD conversion operation.

In the sampling operation, a video signal VSIG is applied to a node VSP (first input node) of the DAC circuit CDACP or a node VSN (second input node) of the DAC circuit CDACN. In the sampling operation, a common mode signal VCM (first reference signal) is applied to the node VIP or the node VIN. In the sampling operation, first electric charge is stored in the plurality of DAC capacitors C2P to C6P, and second electric charge is stored in the plurality of DAC capacitors C2N to C6N. The first electric charge and the second electric charge are stored on the basis of a difference between the electric potential of the video signal VSIG and the electric potential of the common mode signal VCM. In the sampling operation, the electric potential of the common mode signal VCM applied to the node VIP or the node VIN is input to the comparison circuit CMP as a first electric potential. In the AD conversion operation, when the reference signal VREF (second reference signal) is applied to the node VSP or the node VSN, and the first electric charge or the second electric charge is stored, signals input to input nodes of the plurality of DAC capacitors C2P to C6P or input nodes of the plurality of DAC capacitors C2N to C6N are switched to the reference signal VREF or the ground level by the control circuit SARLOGIC, and a second electric potential or a third electric potential is generated. In the AD conversion operation, the second electric potential or the third electric potential is input to the comparison circuit CMP. The comparison circuit CMP compares the first electric potential with the second electric potential or compares the first electric potential with the third electric potential. The control circuit SARLOGIC controls a DAC circuit performing the AD conversion operation out of the DAC circuit CDACP and the DAC circuit CDACN on the basis of a result of the comparison, thereby changing the second electric potential or the third electric potential.

A detailed configuration of the AD converter ADC will be described. As shown in FIG. 4, the AD converter ADC includes a DAC circuit CDACP, a DAC circuit CDACN, a comparison circuit CMP, a control circuit SARLOGIC, a selection switch SEL1, and a selection switch SEL2.

The DAC circuit CDACP includes DAC capacitors C1P to C6P, switches SW1P to SW6P, a clamp switch SWCLP, a sample switch SW_SMPLP, and a reference signal input switch SW_REFP.

The sample switch SW_SMPLP includes a first terminal and a second terminal. The first terminal of the sample switch SW_SMPLP is connected to a signal source SIG_ODD. The second terminal of the sample switch SW_SMPLP is connected to the node VSP. The state of the sample switch SW_SMPLP is switched between on and off. When the sample switch SW_SMPLP is on, the first terminal and the second terminal of the sample switch SW_SMPLP are electrically connected. At this time, a signal from the signal source SIG_ODD is input to the node VSP. On the other hand, when the sample switch SW_SMPLP is off, the first terminal and the second terminal of the sample switch SW_SMPLP are in a high-impedance state. The state of the sample switch SW_SMPLP is controlled using a control signal SMPLP. In a case in which the control signal SMPLP is "H," the sample switch SW_SMPLP is on. On the other hand, in a case in which the control signal SMPLP is "L," the sample switch SW_SMPLP is off. The sample switch SW_SMPLP samples a signal supplied from the signal source SIG_ODD.

Each of the switches SW1P to SW6P includes a first terminal S1, a second terminal S2, and a third terminal D. The first terminal S1 of each of the switches SW1P to SW6P is connected to the node VSP. The second terminal S2 of each of the switches SW1P to SW6P is connected to the ground GND. The third terminal D of each of the switches SW1P to SW6P is connected to one of the DAC capacitors C P to C6P. The state of each of the switches SW1P to SW6P is switched between a first state and a second state. When each of the switches SW1P to SW6P is in the first state, the first terminal S1 of each of the switches SW1P to SW6P and the third terminal D of each of the switches SW P to SW6P are electrically connected. At this time, a video signal VSIG supplied from the signal source SIG_ODD is input to the DAC capacitors C1P to C6P. When each of the switches SW1P to SW6P is in the second state, the second terminal S2 of each of the switches SW1P to SW6P and the third terminal D of each of the switches SW1P to SW6P are electrically connected. At this time, electric charge accumulated in the DAC capacitors C1P to C6P is stored. The states of the switches SW2P to SW6P are controlled using bits DP[2] to DP[6] of a result of the AD conversion. In a case in which the bits DP[2] to DP[6] are "H," the switches SW2P to SW6P are in the first state. On the other hand, in a case in which the bits DP[2] to DP[6] are "L," the switches SW2P to SW6P are in the second state. A control signal that is constantly "H" is input to the switch SW1P. For this reason, the switch SW1P is maintained in the first state. By changing the connection states of the switches SW2P to SW6P in a state in which electric charge is stored in the DAC capacitors C1P to C6P, the electric potential (second electric potential) of the node VIP changes.

Each of the DAC capacitors C1P to C6P includes a first terminal and a second terminal. The first terminals of the DAC capacitors C1P to C6P are respectively connected to the third terminals D of the switches SW P to SW6P. The second terminal of each of the DAC capacitors C1P to C6P is connected to the node VIP. The DAC capacitors C1P to C6P store a signal sampled by the sample switch SW_SMPLP.

The clamp switch SWCLP includes a first terminal and a second terminal. The first terminal of the clamp switch SWCLP is connected to a common mode signal generating circuit that is not shown in the drawing. The second terminal of the clamp switch SWCLP is connected to the node VIP. The state of the clamp switch SWCLP is switched between on and off. When the clamp switch SWCLP is on, the first terminal and the second terminal of the clamp switch SWCLP are electrically connected. At this time, a common mode signal VCM supplied from the common mode signal generating circuit is input to the node VIP. On the other hand, when the clamp switch SWCLP is off, the first terminal and the second terminal of the clamp switch SWCLP are in the high-impedance state. The state of the clamp switch SWCLP is controlled using a control signal CLP. In a case in which the control signal CLP is "H," the clamp switch SWCLP is on. On the other hand, in a case in which the control signal CLP is "L," the clamp switch SWCLP is off. The clamp switch SWCLP inputs the common mode signal VCM to the node VIP.

The reference signal input switch SW_REFP includes a first terminal and a second terminal. The first terminal of the reference signal input switch SW_REFP is connected to a reference signal generating circuit that is not shown in the drawing. The second terminal of the reference signal input switch SW_REFP is connected to the node VSP. The state of the reference signal input switch SW_REFP is switched between on and off. When the reference signal input switch SW_REFP is on, the first terminal and the second terminal of the reference signal input switch SW_REFP are electrically connected. At this time, a reference signal VREF supplied from the reference signal generating circuit is input to the node VSP. When the reference signal input switch SW_REFP is off, the first terminal and the second terminal of the reference signal input switch SW_REFP are in a high-impedance state. The state of the reference signal input switch SW_REFP is controlled using a control signal REFP_EN. In a case in which the control signal REFP_EN is "H," the reference signal input switch SW_REFP is on. On the other hand, in a case in which the control signal REFP_EN is "L," the reference signal input switch SW_REFP is off. The reference signal input switch SW_REFP inputs the reference signal VREF to the node VSP.

The DAC circuit CDACN includes DAC capacitors C1N to C6N, switches SW1N to SW6N, a clamp switch SWCLN, a sample switch SW_SMPLN, and a reference signal input switch SW_REFN.

The sample switch SW_SMPLN includes a first terminal and a second terminal. The first terminal of the sample switch SW_SMPLN is connected to a signal source SIG_EVEN. The second terminal of the sample switch SW_SMPLN is connected to the node VSN. The state of the sample switch SW_SMPLN is switched between on and off. When the sample switch SW_SMPLN is on, the first terminal and the second terminal of the sample switch SW_SMPLN are electrically connected. At this time, a signal supplied from the signal source SIG_EVEN is input to the node VSN. When the sample switch SW_SMPLN is off, the first terminal and the second terminal of the sample switch SW_SMPLN are in a high-impedance state. The state of the sample switch SW_SMPLN is controlled using a control signal SMPLN. In a case in which the control signal SMPLN is "H," the sample switch SW_SMPLN is on. On the other hand, in a case in which the control signal SMPLN is "L," the sample switch SW_SMPLN is off. The sample switch SW_SMPLN samples a signal supplied from the signal source SIG_EVEN.

Each of the switches SW1N to SW6N includes a first terminal S1, a second terminal S2, and a third terminal D. The first terminal S1 of each of the switches SW1N to SW6N is connected to the node VSN. The second terminal S2 of each of the switches SW1N to SW6N is connected to the ground GND. The third terminals D of the switches SW1N to SW6N are respectively connected to the DAC capacitors C1N to C6N. The state of each of the switches SW1N to SW6N is switched between a first state and a second state. When each of the switches SW1N to SW6N is in the first state, the first terminal S1 of each of the switches SW1N to SW6N and the third terminal D of each of the switches SW1N to SW6N are electrically connected. At this time, a signal supplied from the signal source SIG_EVEN is input to the DAC capacitors C1N to C6N. When each of the switches SW1N to SW6N is in the second state, the second terminal S2 of each of the switches SW1N to SW6N and the third terminal D of each of the switches SW1N to SW6N are electrically connected. At this time, electric charges accumulated in the DAC capacitors C1N to C6N are stored. The states of the switches SW2N to SW6N are controlled using bits DN[2] to DN[6] of a result of the AD conversion. In a case in which the bits DN[2] to DN[6] are "H," the switches SW2N to SW6N are in the first state. On the other hand, in a case in which the bits DN[2] to DN[6] are "L," the switches SW2N to SW6N are in the second state. A control signal that is constantly "H" is input to the switch SW1N. For this reason, the switch SW1N is constantly maintained in the first state. By changing the connection states of the switches SW2N to SW6N in a state in which electric charge is stored in the DAC capacitors C1N to C6N, the electric potential of the node VIN (third electric potential) changes.

Each of the DAC capacitors C1N to C6N includes a first terminal and a second terminal. The first terminals of the DAC capacitors C1N to C6N are respectively connected to the third terminals D of the switches SW1N to SW6N. The second terminals of the DAC capacitors C1N to C6N are connected to the node VIN. The DAC capacitors C1N to C6N maintain a signal sampled by the sample switch SW_SMPLN.

The clamp switch SWCLN includes a first terminal and a second terminal. The first terminal of the clamp switch SWCLN is connected to the common mode signal generating circuit that is not shown in the drawing. The second terminal of the clamp switch SWCLN is connected to the node VIN. The state of the clamp switch SWCLN is switched between on and off. When the clamp switch SWCLN is on, the first terminal and the second terminal of the clamp switch SWCLN are electrically connected. At this time, a common mode signal VCM supplied from the common mode signal generating circuit is input to the node VIN. On the other hand, when the clamp switch SWCLN is off, the first terminal and the second terminal of the clamp switch SWCLN are in a high-impedance state. The state of the clamp switch SWCLN is controlled using a control signal CLN. In a case in which the control signal CLN is "H," the clamp switch SWCLN is on. On the other hand, in a case in which the control signal CLN is "L," the clamp switch SWCLN is off. The clamp switch SWCLN inputs the common mode signal VCM to the node VIN.

The reference signal input switch SW_REFN includes a first terminal and a second terminal. The first terminal of the reference signal input switch SW_REFN is connected to a reference signal generating circuit that is not shown in the drawing. The second terminal of the reference signal input switch SW_REFN is connected to the node VSN. The state of the reference signal input switch SW_REFN is switched between on and off. When the reference signal input switch SW_REFN is on, the first terminal and the second terminal of the reference signal input switch SW_REFN are electrically connected. At this time, a reference signal VREF supplied from the reference signal generating circuit is input to the node VSN. When the reference signal input switch SW_REFN is off, the first terminal and the second terminal of the reference signal input switch SW_REFN are in a high-impedance state. The state of the reference signal input switch SW_REFN is controlled using a control signal REFN_EN. In a case in which the control signal REFN_EN is "H," the reference signal input switch SW_REFN is on. On the other hand, in a case in which the control signal REFN_EN is "L," the reference signal input switch SW_REFN is off. The reference signal input switch SW_REFN inputs the reference signal VREF to the node VSN.

The capacitance values of the DAC capacitors C2P to C6P and the DAC capacitors C2N to C6N are weighted. For the convenience of description, the capacitance value of each DAC capacitor is represented using a reference sign of the corresponding DAC capacitor. The capacitance value of each DAC capacitor is represented by Equation (4).

$$C6P=C6N=C/2^1, C5P=C5N=C/2^2, \ldots$$
$$C2P=C2N=C/2^5 \quad (4)$$

The DAC capacitor C1P and the DAC capacitor C1N are capacitors having characteristics of dummy capacitors. The capacitance values of the DAC capacitor C1P and the DAC capacitor C1N are represented by Equation (5).

$$C1P=C1N=C/2^5 \quad (5)$$

The DAC capacitor C1P and the DAC capacitor C1N are necessary for causing a sum value of the capacitance values of the DAC circuit CDACP and the DAC circuit CDACN to be C. Here, C is represented by Equation (6).

$$C=C/2^1+C/2^2 \ldots +C/2^5+C/2^5 \quad (6)$$

The DAC capacitor C1P and the DAC capacitor C1N having characteristics of dummy capacitors are not essential elements for the configuration of the AD converter ADC. However, the DAC capacitor C1P and the DAC capacitor C1N are elements that are necessary for the simplification of description to be presented later and realization of an AD converter having high accuracy in actual design. For this reason, in each embodiment of the present invention, the DAC capacitor C1P and the DAC capacitor C1N are intentionally described.

The DAC circuit CDACP is connected to a signal source SIG_ODD. The DAC circuit CDACN is connected to a signal source SIG_EVEN. A video signal VSIG generated by the signal source SIG_ODD is supplied to the node VSP. The signal source SIG_ODD corresponds to the imaging unit PIX and the column circuits COL<1> to COL<n−1> of odd-numbered columns shown in FIG. 1. A video signal VSIG generated by the signal source SIG_EVEN is supplied to the node VSN. The signal source SIG_EVEN corresponds to the imaging unit PIX and the column circuits COL<2> to COL<n> of even-numbered columns shown in FIG. 1. A reference signal VREF generated by a reference signal generating circuit that is not shown in the drawing is supplied to the node VSP and the node VSN.

The node VSP is connected to the second terminal of the sample switch SW_SMPLP, the second terminal of the reference signal input switch SW_REFP, and the first terminals S1 of the switches SW1P to SW5P. The node VSP is an arbitrary position on a signal line that is electrically connected to these. The node VSN is connected to the second terminal of the sample switch SW_SMPLN, the second terminal of the reference signal input switch SW_REFN, and the first terminals S1 of the switches SW1N to SW5N. The node VSN is an arbitrary position on a signal line that is electrically connected to these.

The node VIP is connected to the second terminals of the DAC capacitors C1P to C6P, the second terminal of the clamp switch SWCLP, and the first input terminal of the comparison circuit CMP. The node VIP is an arbitrary position on a signal line that is electrically connected to these. The node VIN is connected to the second terminals of the DAC capacitors C1N to C6N, the second terminal of the clamp switch SWCLN, and the second input terminal of the comparison circuit CMP. The node VIN is an arbitrary position on a signal line that is electrically connected to these.

The comparison circuit CMP includes a first input terminal (non-inverted input terminal), a second input terminal (inverted input terminal), a first output terminal (inverted output terminal), and a second output terminal (non-inverted output terminal). The first input terminal of the comparison circuit CMP is connected to the node VIP. When the DAC circuit CDACP performs a sampling operation, an electric potential (first electric potential) based on the common mode signal VCM is input to the first input terminal of the comparison circuit CMP. When the DAC circuit CDACP performs an AD conversion operation, an electric potential (second electric potential) based on the video signal VSIG, the reference signal VREF, and the common mode signal VCM is input to the first input terminal of the comparison circuit CMP. The second input terminal of the comparison circuit CMP is connected to the node VIN. When the DAC circuit CDACN performs a sampling operation, an electric potential (first electric potential) based on the common mode signal VCM is input to the second input terminal of the comparison circuit CMP. When the DAC circuit CDACN performs an AD conversion operation, an electric potential (third electric potential) based on the video signal VSIG, the reference signal VREF, and the common mode signal VCM is input to the second input terminal of the comparison circuit CMP. The first output terminal and the second output terminal of the comparison circuit CMP are connected to the selection switch SEL1. The comparison circuit CMP compares the electric potential of the node VIP with the electric potential of the node VIN. The comparison circuit CMP outputs a signal VON based on a result of the comparison from the first output terminal and outputs a signal VOP based on the result of the comparison from the second output terminal.

In a first period, the DAC circuit CDACP performs a sampling operation, and the DAC circuit CDACN performs an AD conversion operation. At this time, the electric potential of the node VIP is that of the common mode signal VCM, and the electric potential of the node VIN is an electric potential based on the second electric charge stored in the DAC capacitors C1N to C6N. For example, in a case in which the electric potential based on the second electric charge is higher than the electric potential of the common mode signal VCM, the signal VOP is less than the signal VON (VOP<VON). In a case in which the electric potential based on the second electric charge is lower than the electric potential of the common mode signal VCM, the signal VOP is greater than the signal VON (VOP>VON).

In a second period different from the first period, the DAC circuit CDACP performs an AD conversion operation, and the DAC circuit CDACN performs a sampling operation. At this time, the electric potential of the node VIP is an electric potential based on the first electric charge stored in the DAC capacitors C1P to C6P, and the electric potential of the node VIN is that of the common mode signal VCM. For example, in a case in which the electric potential based on the first electric charge is higher than that of the common mode signal VCM, the signal VOP is greater than the signal VON (VOP>VON). On the other hand, in a case in which the electric potential based on the first electric charge is lower than the electric potential of the common mode signal VCM, the signal VOP is less than the signal VON (VOP<VON).

The selection switch SEL1 includes a first input terminal S1, a second input terminal S2, a first output terminal D1, and a second output terminal D2. The first input terminal S1 of the selection switch SEL1 is connected to the first output terminal of the comparison circuit CMP. The signal VON is input to the first input terminal S1 of the selection switch SEL1. The second input terminal S2 of the selection switch SEL1 is connected to the second output terminal of the comparison circuit CMP. The signal VOP is input to the second input terminal S2 of the selection switch SEL1. The first output terminal D1 and the second output terminal D2 of the selection switch SEL1 are connected to the control circuit SARLOGIC.

As described above, in the first period, in a case in which the electric potential based on the second electric charge is higher than the electric potential of the common mode signal VCM, the signal VOP is less than the signal VON (VOP<VON). In the second period, in a case in which the electric potential based on the first electric charge is higher than the electric potential of the common mode signal VCM, the signal VOP is greater than the signal VON (VOP>VON). In other words, although the result of the comparison in the first period is the same as the result of the comparison in the second period, the magnitude relationship between the signal VOP and the signal VON is different therebetween. In order to cause the magnitude relationship between two signals input to the control circuit SARLOGIC to be constant in a case in which the result of the comparison is constant in the first period and the second period, the selection switch SEL1 is arranged.

The connection between the input terminal and the output terminal of the selection switch SEL1 can be switched. The selection switch SEL1 is switched between a first state and a second state. In the first period described above, the selection switch SEL1 is in the first state. When the selection switch SEL1 is in the first state, the first input terminal S1 of the selection switch SEL1 and the first output terminal D1 of the selection switch SEL1 are electrically connected, and the second input terminal S2 of the selection switch SEL1 and the second output terminal D2 of the selection switch SEL1 are electrically connected. At this time, the signal VON is output from the first output terminal D1 of the selection switch SEL1, and the signal VOP is output from the second output terminal D2 of the selection switch SEL1. In the second period described above, the selection switch SEL1 is in the second state. When the selection switch SEL1 is in the second state, the first input terminal S1 of the selection switch SEL1 and the second output terminal D2 of the selection switch SEL1 are electrically connected, and the second input terminal S2 of the selection switch SEL1 and the first output terminal D1 of the selection switch SEL1 are electrically connected. At this time, the signal VON is output from the second output terminal D2 of the selection switch SEL1, and the signal VOP is output from the first output terminal D1 of the selection switch SEL1.

The control circuit SARLOGIC includes a first input terminal, a second input terminal, and an output terminal. The first input terminal of the control circuit SARLOGIC is connected to the first output terminal D1 of the selection switch SEL1. The second input terminal of the control circuit SARLOGIC is connected to the second output terminal D2 of the selection switch SEL1. A signal supplied from the first output terminal D1 of the selection switch SEL1 is input to the first input terminal of the control circuit SARLOGIC, and a signal supplied from the second output terminal D2 of the selection switch SEL1 is input to the second input terminal of the control circuit SARLOGIC. The control circuit SARLOGIC generates a digital signal D[6:1] that is a result of the AD conversion on the basis of the signal VOP and the signal VON supplied from the comparison circuit CMP. The control circuit SARLOGIC outputs the digital signal D[6:1] from the output terminal. The digital signal D[6:1] is output to a circuit of a later stage of the AD converter ADC as the result of the AD conversion. While the AD converter ADC is an AD converter of a 6-bit output, the AD converter is not limited to this example. The number of output bits of the AD converter ADC may be arbitrarily set.

The selection switch SEL2 includes a first input terminal S1, a second input terminal S2, a first output terminal D1, and a second output terminal D2. The first input terminal S of the selection switch SEL2 is connected to a power supply that outputs a power source voltage VDD. The power source voltage VDD is input to the first input terminal S1 of the selection switch SEL2. The second input terminal S2 of the selection switch SEL2 is connected to the control circuit SARLOGIC. The digital signal D[6:1] is input to the second input terminal S2 of the selection switch SEL2. A digital signal DP[6:2] is output from the first output terminal D1 of the selection switch SEL2. Bits constituting the digital signal DP[6:2] are output to the switches SW2P to SW6P. The digital signal DN[6:2] is output from the second output terminal D2 of the selection switch SEL2. Bits constituting the digital signal DN[6:2] are output to the switches SW2N to SW6N.

In the first period, the DAC circuit CDACP performs a sampling operation, and the DAC circuit CDACN performs an AD conversion operation. In the first period, the first terminals S1 of the switches SW1P to SW6P and the third terminals D of the switches SW1P to SW6P are connected. At this time, bits DP[1] to DP[6] input to the switches SW1P to SW6P are "H." In the second period, the DAC circuit CDACP performs an AD conversion operation, and the DAC circuit CDACN performs a sampling operation. In the second period, the first terminals S1 of the switches SW1N to SW6N and the third terminals D of the switches SW1N to SW6N are connected. At this time, bits DN[1] to DN[6] input to the switches SW1N to SW6N are "H." In order to realize this operation, the selection switch SEL2 is disposed.

The control circuit SARLOGIC may have the functions of the selection switch SEL1 and the selection switch SEL2. Accordingly, the selection switch SE1 and the selection switch SEL2 are not essential elements of the AD converter ADC.

The control circuit SARLOGIC controls the DAC circuit that performs the AD conversion operation. In the first period described above, the control circuit SARLOGIC outputs a digital signal D[6:1] to the selection switch SEL2. The selection switch SEL2 respectively outputs five high-order bits of the digital signal D[6:1] to the switches SW6N to SW2N as bits DN[6] to DN[2], thereby controlling the DAC circuit CDACN. In the second period described above, the control circuit SARLOGIC outputs the digital signal D[6:1] to the selection switch SEL2. The selection switch SEL2 respectively outputs five high-order bits of the digital signal D[6:1] to the switches SW6P to SW2P as bits DP[6] to DP[2], thereby controlling the DAC circuit CDACP. A bit D[1] that is the least significant bit D[1] constituting the digital signal D[6:1] is not used for controlling the DAC circuit CDACP and the DAC circuit CDACN. Accordingly control signals input to the switch SW1P and the switch SW1N corresponding to the least significant bit are maintained to be fixed to "H."

Figure 5:
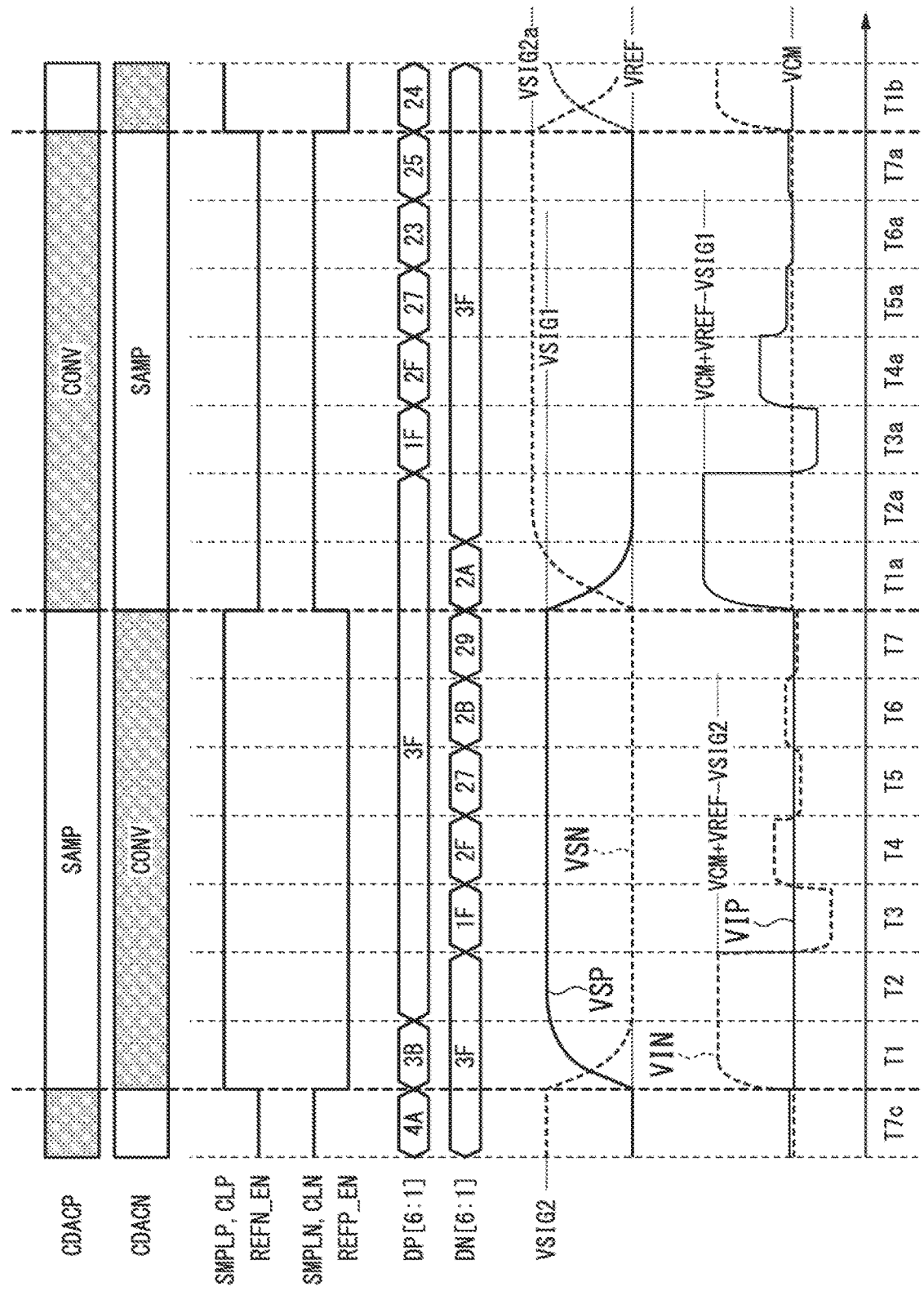
FIG. 5 is a timing diagram showing the operation of the AD converter according to the first embodiment of the present invention.

The operation of the AD converter ADC will be described with reference to FIG. 5. FIG. 5 shows signals relating to the operation of the AD converter ADC. In FIG. 5, the state of the DAC circuit CDACP and the state of the DAC circuit CDACN are shown. In FIG. 5, a control signal SMPLP, a control signal CLP, a control signal REFN_EN, a control signal SMPLN, a control signal CLN, and a control signal REFP_EN are shown. In FIG. 5, a digital signal DP[6:1] and a digital signal DN[6:1] are represented in hexadecimal digits. In FIG. 5, the electric potentials of a node VSP, a node VSN, a node VIP, and a node VIN are shown. In FIG. 5, the horizontal axis represents time, and the vertical axis represents a signal level.

In a period T1 to a period T7, the DAC circuit CDACP performs a sampling operation SAMP, thereby sampling a signal input to the DAC circuit CDACP. In the period T1 to the period T7, since the switch SW_SMPLP and the clamp switch SWCLP are on, a video signal VSIG1 is input from the signal source SIG_ODD to the node VSP.

In a period T2, the first input terminal S1 and the first output terminal D1 of each of the selection switch SEL1 and the selection switch SEL2 are connected, and the second input terminal S2 and the second output terminal D2 of each of the selection switch SEL1 and the selection switch SEL2 are connected. Accordingly, bits DP[2] to DP[6] that are "H" are input to the switches SW2P to SW6P. A control signal that is constantly "H" is input to the switch SW1P. In the period T2, the first terminal S1 and the third terminal D of each of the switches SW1P to SW6P are connected, whereby a video signal VSIG1 is sampled, and first electric charge is stored in a plurality of DAC capacitors C1P to C6P.

In the period T1 to the period T7, since the switch SW_REFP is off an input of the reference signal VREF to the node VSP is stopped. In the period T1 to the period T7, since the clamp switch SWCLP is on, a common mode signal VCM is input to the node VIP. In the period T1 to the period T7, the electric potential of the node VIP is maintained to be the electric potential of the common mode signal VCM, and the electric potential of the node VSP is maintained to be the electric potential of the video signal VSIG1. In the period T2 to the period T7, electric charge based on the video signal VSIG1 and the common mode signal VCM is stored in the DAC capacitors C1P to C6P.

In the period T1 to the period T7, the DAC circuit CDACN performs an AD conversion operation CONV thereby performing an AD conversion of a signal sampled in the DAC circuit CDACN. In the period T1 to the period T7, since the switch SW_SMPLN and the clamp switch SWCLN are off inputs of the video signal VSIG output from the signal source SIG_EVEN and the common mode signal VCM to the node VSN are stopped. In the period T1 to the period T7, since the switch SW_REFN is on, the reference signal VREF is input to the node VSN. Accordingly, the reference signal VREF is input to the first terminal of each of the DAC capacitors C1N to C6N. By applying the conservation law of electric charge to the states before and after the period T1, the electric potential of the node VIN in the period T1 is represented using Equation (7). In Equation (7), VSIG2 is a voltage sampled in the node VSN immediately before the start of the period T1. For the convenience of description, the electric potential of the common mode signal VCM is represented as VCM, the electric potential of the video signal VSIG2 is represented as VSIG2, and the electric potential of the reference signal VREF is represented as VREF.

$$VIN=VCM-(VSIG2-VREF) \tag{7}$$

A period of the period T2 to the period T7 corresponds to a period for the AD converter ADC to perform comparisons of electric potentials of the MSB to the LSB on the basis of the electric charge stored in the DAC circuit CDACN. In the period T2, the comparison circuit CMP compares the electric potential of the node VIP with the electric potential of the node VIN. In accordance with this comparison, the logic of the most significant bit D6 of the result of the AD conversion is decided. As a result, the state of a switch disposed on a side of higher electric potential node out of the node VIP and the node VIN is switched. The comparison circuit CMP outputs the result of the comparison to the control circuit SARLOGIC through the selection switch SEL1. In the period T3, the control circuit SARLOGIC outputs a bit D6 corresponding to the result of the comparison in the period T2. In a case in which a result of the determination for the bit D6 is VIN>VIP, the logic level of the bit D6 is "L." For the convenience of description, the electric potential of the node VIP is represented as VIP, and the electric potential of the node VIN is represented as VIN. On the other hand, in a case in which the result of the determination for the bit D6 is VIN<VIP, the logic level of the bit D6 is "H." In a case in which a result of the determination for a second or subsequent bit Di is VIN>VIP, the logic level of the bit Di is set to "L." On the other hand, in a case in which the result of the determination for the bit Di is VIN<VIP, the logic level of the bit Di is set to "L," and the logic level of the previous bit D(i+1) is set to "H." Here, i is an integer of "1" to "5."

In the period T2 of the example shown in FIG. 5, since the electric potential of the node VIN is higher than the electric potential of the node VIP, the control circuit SARLOGIC sets the logic of the bit D6 to "L." In the period T3, the logic level of the bit D6 is output through the selection switch SEL2 as a bit DN[6]. As a result, the digital signal DN[6:1] represented in hexadecimal digits is changed from 3F (111111) to the 1F (011111). The bit DN[6] is input to the switch SW6N. For this reason, the switch SW6N is switched to a state in which the second terminal S2 and the third terminal D are connected. Accordingly, the ground level is input to the first terminal of the DAC capacitor C6N. In accordance with the change in the state of the switch SW6N in a state in which a total amount of electric charge accumulated in the DAC capacitors C1N to C6N is conserved, the electric potential of the node VIN decreases by (½) VREF.

After the change in the electric potential of the node VIN is stabilized, in the period T3, the comparison circuit CMP compares the electric potential of the node VIP with the electric potential of the node VIN for determining the logic level of the bit D5. In the period T3, since the electric potential of the node VIP is higher than the electric potential of the node VIN, the control circuit SARLOGIC sets the logic of the bit D5 to "L" and sets the logic of the bit D6 to "H." In the period T4, the logic levels of the bit D6 and the bit D5 are output through the selection switch SEL2 as a bit DN[6] and a bit DN[5]. As a result, the digital signal DN[6:1] represented in hexadecimal digits is changed from 1F (011111) to 2F (101111). The bit DN[6] is input to the switch SW6N. For this reason, the switch SW6N is switched to a state in which the first terminal S1 and the third terminal D are connected. The bit DN[5] is input to the switch SW5N. For this reason, the switch SW5N is switched to a state in which the second terminal S2 and the third terminal D are connected. Accordingly, the ground level is input to the first terminal of the DAC capacitor C5N. The states of the switch SW6N and the switch SW5N are changed in the state in which a total amount of electric charge accumulated in the DAC capacitors C1N to C6N is conserved, whereby the electric potential of the node VIN increases by ($½^2$) VREF.

After the change in the electric potential of the node VIN is stabilized, in the period T4, the comparison circuit CMP compares the electric potential of the node VIP with the electric potential of the node VIN for determining the logic level of the bit D4. In the period T4, since the electric potential of the node VIN is higher than the electric potential of the node VIP, the control circuit SARLOGIC sets the logic of the bit D4 to "L." In the period T5, the logic level of the bit D4 is output through the selection switch SEL2 as a bit DN[4]. As a result, the digital signal DN[6:1] represented in hexadecimal digits is changed from 2F (101111) to 27 (100111). The bit DN[4] is input to the switch SW4N. For this reason, the switch SW4N is switched to a state in which the second terminal S2 and the third terminal D are connected. Accordingly, the ground level is input to the first terminal of the DAC capacitor C4N. The state of the switch SW4N is changed in a state in which a total amount of electric charge accumulated in the DAC capacitors C1N to C6N is conserved, whereby the electric potential of the node VIN decreases by ($½^3$) VREF.

After the change in the electric potential of the node VIN is stabilized, in the period T5, the comparison circuit CMP compares the electric potential of the node VIP with the electric potential of the node VIN for determining the logic level of the bit D3. In the period T5, since the electric potential of the node VIP is higher than the electric potential of the node VIN, the control circuit SARLOGIC sets the logic of the bit D3 to "L" and sets the logic of the bit D4 to "H." In the period T6, the logic levels of the bit D4 and the bit D3 are output through the selection switch SEL2 as a bit DN[4] and a bit DN[3]. As a result, the digital signal DN[6:1] represented in hexadecimal digits is changed from 27 (100111) to 2B (101011). The bit DN[4] is input to the switch SW4N. For this reason, the switch SW4N is switched to a state in which the first terminal S1 and the third terminal D are connected. The bit DN[3] is input to the switch SW3N. For this reason, the switch SW3N is switched to a state in which the second terminal S2 and the third terminal D are connected. Accordingly, the ground level is input to the first terminal of the DAC capacitor C3N. The states of the switch SW4N and the switch SW3N are changed in a state in which a total amount of electric charge accumulated in the DAC capacitors C1N to C6N is conserved, whereby the electric potential of the node VIN increases by ($½^4$) VREF.

After the change in the electric potential of the node VIN is stabilized, in the period T6, the comparison circuit CMP compares the electric potential of the node VIP with the electric potential of the node VIN for determining the logic level of the bit D2. In the period T6, since the electric potential of the node VIN is higher than the electric potential of the node VIP, the control circuit SARLOGIC sets the logic of the bit D2 to "L." In the period T7, the logic level of the bit D2 is output through the selection switch SEL2 as a bit DN[2]. As a result, the digital signal DN[6:1] represented in hexadecimal digits is changed from 2B (101011) to 29 (101001). The bit DN[2] is input to the switch SW2N. For this reason, the switch SW2N is switched to a state in which the second terminal S2 and the third terminal D are connected. Accordingly, the ground level is input to the first terminal of the DAC capacitor C2N. The state of the switch SW2N is changed in a state in which a total amount of electric charge accumulated in the DAC capacitors C1N to C6N is conserved, whereby the electric potential of the node VIN decreases by ($1/2^5$) VREF.

After the change in the electric potential of the node VIN is stabilized, in the period T7, the comparison circuit CMP compares the electric potential of the node VIP with the electric potential of the node VIN for determining the logic level of the bit D1. In the period 1T7, since the electric potential of the node VIP is higher than the electric potential of the node VIN, the control circuit SARLOGIC sets the logic of the bit D1 to "L" and sets the logic of the bit D2 to "H." In a period T1$a$, the logic levels of the bit D2 and the bit D1 are output through the selection switch SEL2 as a bit DN[2] and a bit DN[1]. As a result, the digital signal DN[6:1] represented in hexadecimal digits is changed from 29 (101001) to 2A (101010). The digital signal DN[6:1] acquired in this way is used by an external signal processing system.

In the period T1$a$ to a period T7$a$, the DAC circuit CDACP performs an AD conversion operation CONV, thereby performing an AD conversion of a signal sampled in the DAC circuit CDACP. In the period T1$a$ to the period T7$a$, the DAC circuit CDACN performs a sampling operation SAMP, thereby sampling a signal input to the DAC circuit CDACN. In order to maintain compatibility of the operation of the control circuit SARLOGIC, in the period T1$a$ to the period T7$a$, the selection switch SEL1 and the selection switch SEL2 are in a state in which the first input terminal S1 and the second output terminal D2 are connected, and the second input terminal S2 and the first output terminal D1 are connected. The digital signal DP[6:1] is used by an external signal processing system. In the period T1$a$ to the period T7$a$, operations other than the operations described above are similar to the operations performed in the period T1 to the period T7.

Each of the first DAC circuit and the second DAC circuit of the AD converter according to each aspect of the present invention need not have components other than the DAC capacitors. In addition, a signal that is input to the AD converter according to each aspect of the present invention and is a target for the AD conversion may be a signal other than a video signal. The image sensor according to each aspect of the present invention need not have components other than the plurality of pixels, the plurality of column circuits, and the AD converter.

In the AD converter ADC according to the first embodiment, in a period in which one of the two DAC circuits performs an AD conversion operation, the other DAC circuit performs a sampling operation. In this way, the two DAC circuits of the AD converter ADC can simultaneously perform a sampling operation and an AD conversion operation. For this reason, the AD converter ADC can perform the AD conversion at a high speed. Since the comparison circuit CMP and the control circuit SARLOGIC for performing an AD conversion are shared by two DAC circuits, the size of the chip area can be decreased.

In a case in which the AD converter ADC is mounted in the image sensor IMG, the AD converter ADC can perform an AD conversion of a signal output from a column circuit COL of an odd-numbered column and, simultaneously, sample a signal output from a column circuit COL of an even-numbered column. Alternatively, the AD converter ADC can perform an AD conversion of a signal output from a column circuit COL of an even-numbered column and, simultaneously, sample a signal output from a column circuit COL of an odd-numbered column. For this reason, the image sensor IMG can perform the AD conversion at a high speed.

Modified Example of First Embodiment

Figure 6:
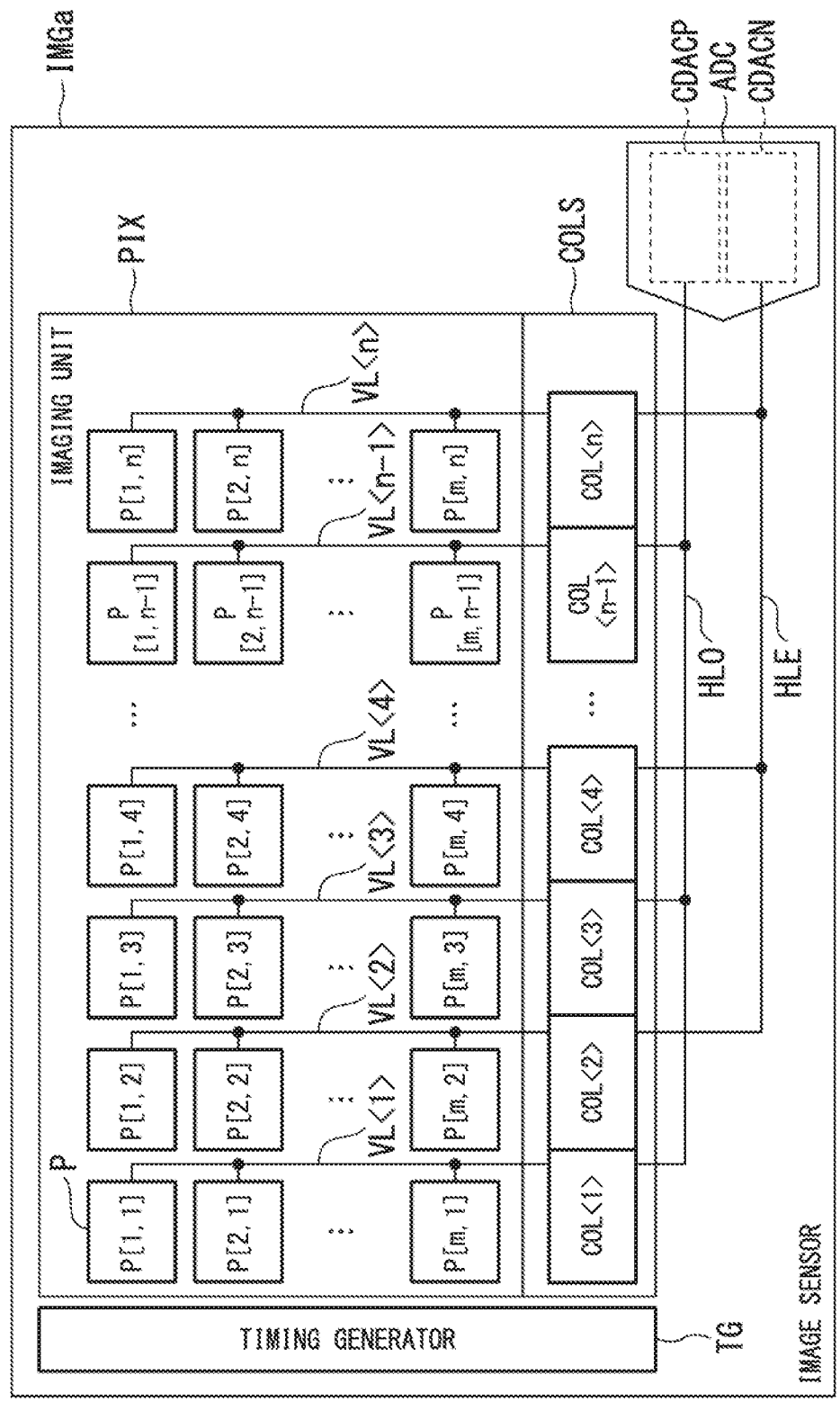
FIG. 6 is a block diagram showing the entire configuration of an image sensor of a modified example of the first embodiment of the present invention.

The entire configuration of an image sensor IMGa of a modified example of the first embodiment will be described with reference to FIG. 6. FIG. 6 shows the entire configuration of the image sensor IMGa. In the configuration shown in FIG. 6, points different from the configuration shown in FIG. 1 will be described.

In the image sensor IMGa, a DAC circuit CDACP is connected to column circuits COL<1> to COL<n-1> of odd-numbered columns, and a DAC circuit CDACN is connected to column circuits COL<2> to COL<n> of even-numbered columns. The image sensor IMGa includes two different horizontal signal lines HLO and HLE. The horizontal signal line HLO is connected to the column circuits COL<1> to COL<n-1> of odd-numbered columns and the DAC circuit CDACP. The horizontal signal line HLE is connected to the column circuits COL<2> to COL<n> of even-numbered columns and the DAC circuit CDACN. The number of column circuits COL connected to each of the horizontal signal line HLO and the horizontal signal line HLE is a half of the number of column circuits COL connected to the horizontal signal line HL of the image sensor IMG shown in FIG. 1. For points other than those described above, the configuration shown in FIG. 6 is similar to the configuration shown in FIG. 1.

Since an analog switch not shown in the drawing is present inside each column circuit COL, parasitic capacitance is generated in an output terminal of the column circuit COL. The column circuit COL needs to drive this parasitic capacitance in addition to the DAC circuit. In the image sensor IMGa, parasitic capacitance connected to the horizontal signal line HLO and the horizontal signal line HLE is lower than the parasitic capacitance connected to the horizontal signal line HL of the image sensor IMG. For this reason, the image sensor IMGa can be operated at a higher speed with lower power consumption.

Second Embodiment

Figure 7:
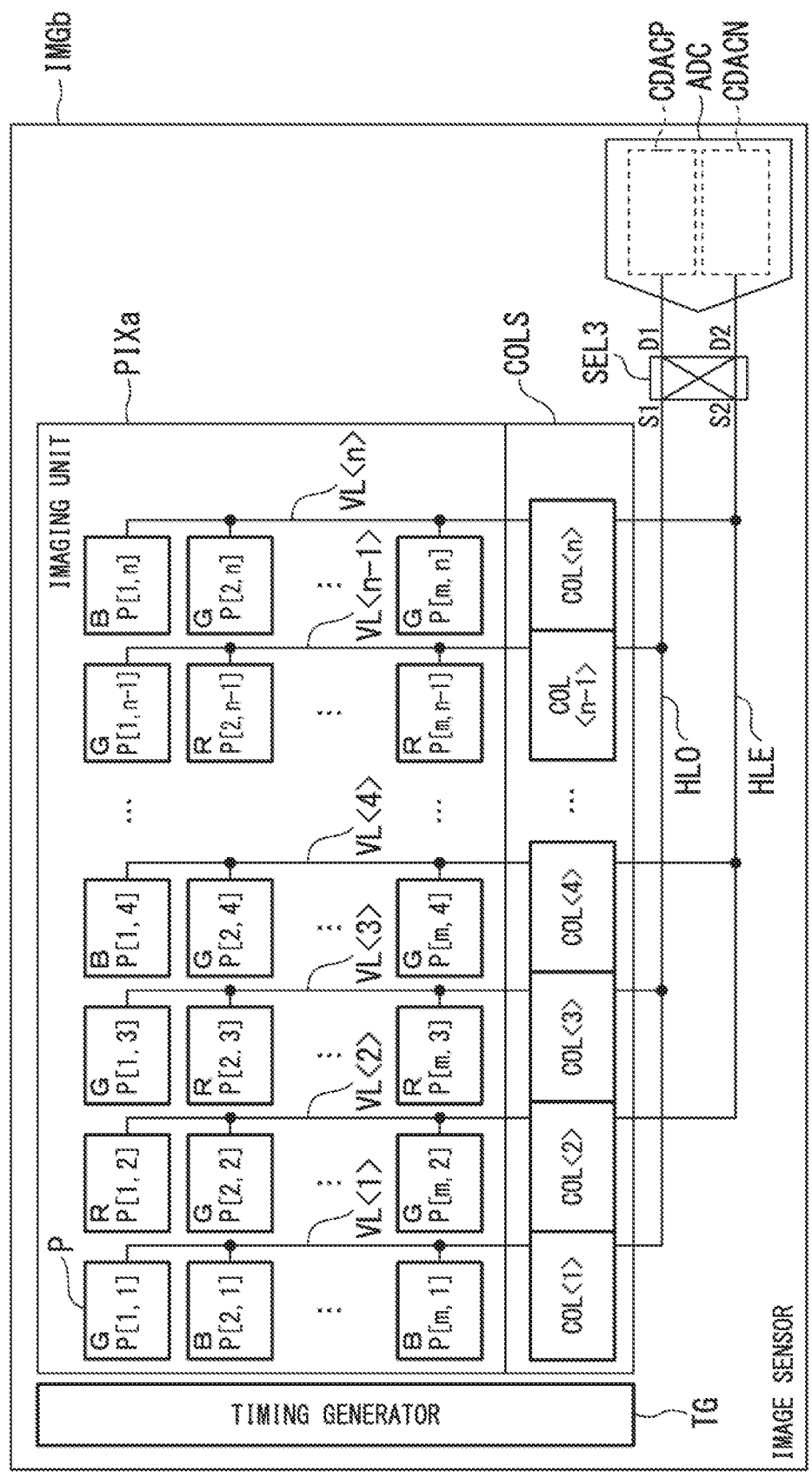
FIG. 7 is a block diagram showing the entire configuration of an image sensor according to a second embodiment of the present invention.

The entire configuration of an image sensor IMGb according to a second embodiment of the present invention will be described with reference to FIG. 7. FIG. 7 shows the entire configuration of the image sensor IMGb. For the configuration shown in FIG. 7, points different from those of the configuration shown in FIG. 6 will be described.

The image sensor IMGb has the same configuration as the configuration of the image sensor IMGa and includes a selection switch SEL3. The selection switch SEL3 includes a first input terminal S1, a second input terminal S2, a first output terminal D1, and a second output terminal D2. The first input terminal S of the selection switch SEL3 is connected to the horizontal signal line HLO. Video signals VSIG supplied from column circuits COL<1> to COL<n-1> of odd-numbered columns are input to the first input terminal S of the selection switch SEL3. The second input terminal S2 of the selection switch SEL3 is connected to the horizontal signal line HLE. In addition, video signals VSIG supplied from column circuits COL<2> to COL<n> of even-numbered columns are input to the second input terminal S2 of the selection switch SEL3. The first output terminal D1 of the selection switch SEL3 is connected to a DAC circuit CDACP of an AD converter ADC. The second output terminal D2 of the selection switch SEL3 is connected to a DAC circuit CDACN of the AD converter ADC.

The imaging unit PIX of the image sensor IMGa is replaced with an imaging unit PIXa. Each of a plurality of pixels P disposed in the imaging unit PIXa includes a color filter. The plurality of pixels P includes pixels P(G) including a green color filter, pixels P(B) including a blue color filter, and pixels P(R) including a red color filter. The green color filter transmits only green light included in visible light. The blue color filter transmits only blue light included in visible light. The red color filter transmits only red light included in visible light. In FIG. 7, the pixels P(G) are represented as "G," the pixels P(B) are represented as "B," and the pixels P(R) are represented as "R." The number of pixels P including color filters of each color is two or more.

The pixels P including the color filters of each color are periodically arranged. The plurality of pixels P constitute a Bayer array. Two pixels P(G), one pixel P(B), and one pixel P(R) constitute a unit array of the Bayer array. Such unit arrays are two-dimensionally arranged periodically. Each pixel P of an odd-numbered row and an odd-numbered column is the pixel P(G). Each pixel P of an odd-numbered row and an even-numbered column is the pixel P(R). Each pixel P of an even-numbered row and an odd-numbered column is the pixel P(B). Each pixel P of an even-numbered row and an even-numbered column is the pixel P(G). In the configuration shown in FIG. 7, points other than those described above are similar to those of the configuration shown in FIG. 6.

When signals supplied from pixels P of odd-numbered rows are read, the first input terminal S1 of the selection switch SEL3 and the first output terminal D1 of the selection switch SEL3 are connected, and the second input terminal S2 of the selection switch SEL3 and the second output terminal D2 of the selection switch SEL3 are connected. Accordingly, video signals VISG output from the pixels P(G) of odd-numbered columns are input to the DAC circuit CDACP, and video signals VSIG output from the pixels P(R) of even-numbered columns are input to the DAC circuit CDACN.

When signals supplied from pixels P of even-numbered rows are read, the first input terminal S1 of the selection switch SEL3 and the second output terminal D2 of the selection switch SEL3 are connected, and the second input terminal S2 of the selection switch SEL3 and the first output terminal D1 of the selection switch SEL3 are connected. Accordingly, the video signals VSIG output from the pixels P(G) of the even-numbered columns are input to the DAC circuit CDACP, and the video signals VSIG output from the pixels P(B) of the odd-numbered columns are input to the DAC circuit CDACN.

The operations of the image sensor IMGb other than those described above are the same as the operations of the image sensor IMG according to the first embodiment.

The image sensor IMGb includes pixels P of three colors. The image sensor IMGb may include pixels P of two colors or more. A color filter included in each pixel P may be a complementary color filter. In other words, the pixels P(G) may be replaced with pixels P of a magenta color, the pixels P(B) may be replaced with pixels P of a yellow color, and the pixels P(R) may be replaced with pixels P of a cyan color. A combination of the color filters is arbitrary. The array of color filters may be freely changed in the scope of the claims.

As described above, the image sensor IMGb includes the AD converter ADC and the plurality of pixels P disposed in a matrix pattern. The plurality of pixels P include a plurality of first pixels P and a plurality of second pixels P. Each first pixel P included in the plurality of first pixels P includes a color filter of a first color. Each second pixel P included in the plurality of second pixels P includes a color filter of a second color that is different from the first color. For example, the first color and the second color are any two of green, blue, and red. The plurality of first pixels P and the plurality of second pixels P are periodically arranged. Signals output from the first pixels P are input to one of the DAC circuit CDACP and the DAC circuit CDACN. Signals output from the second pixels P are input to a DAC circuit other than the DAC circuit to which the signals output from the first pixels P are input.

In accordance with the control described above, the video signals VSIG output from the pixels P(G) are sampled by the DAC circuit CDACP, and video signals VSIG output from the pixels P(B) or the pixels P(R) are sampled by the DAC circuit CDACN. As a result, video signals VSIG output from pixels P including color filters of the same color are processed constantly by the same analog signal processing system. Accordingly, the influence of unbalance between the DAC circuit CDACP and the DAC circuit CDACN on an imaging result acquired by the image sensor IMGb can be minimized. Particularly, color noises according to the unbalance between the DAC circuit CDACP and the DAC circuit CDACN are reduced. For this reason, the image sensor IMGb can acquire an image having high image quality.

Modified Example of Second Embodiment

Figure 8:
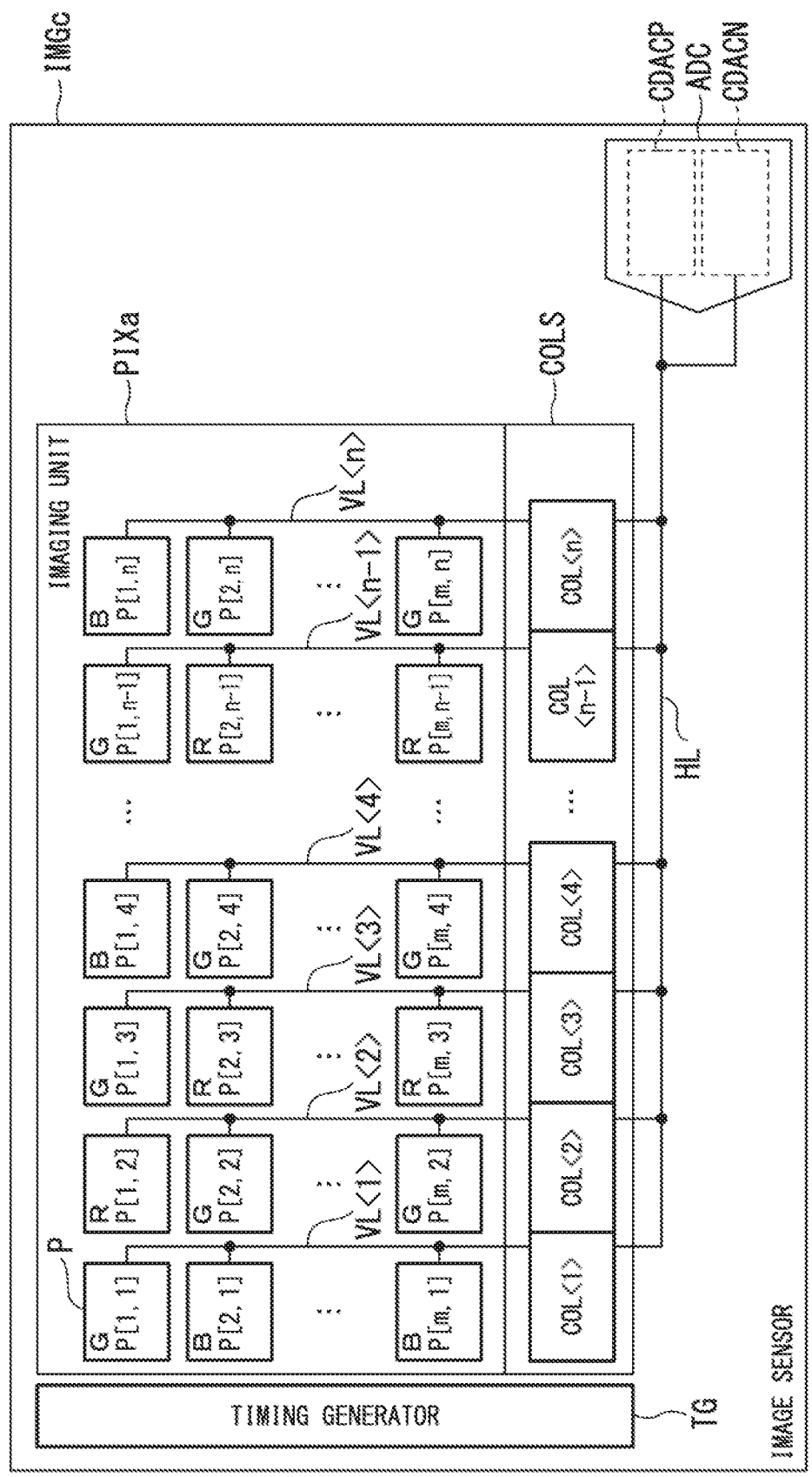
FIG. 8 is a block diagram showing the entire configuration of an image sensor of a modified example of the second embodiment of the present invention.

The entire configuration of an image sensor IMGc according to a modified example of the second embodiment will be described with reference to FIG. 8. FIG. 8 shows the entire configuration of the image sensor IMGc. In the configuration shown in FIG. 8, points different from those of the configuration shown in FIG. 1 will be described.

The imaging unit PIX of the image sensor IMGa is replaced with an imaging unit PLXa. The imaging unit PIXa is the same as the imaging unit PIXa included in the image sensor IMGb shown in FIG. 7. For points other than those described above, the configuration shown in FIG. 8 is the same as the configuration shown in FIG. 1.

The image sensor IMGc does not include the selection switch SEL3. However, by appropriately controlling a switch SW_SMPLP of the DAC circuit CDACP and a switch SW_SMPLN of the DAC circuit CDACN using the image sensor IMGc, functions equivalent to the functions of the image sensor IMGb shown in FIG. 7 are realized. For example, when signals supplied from pixels P of odd-numbered rows and odd-numbered columns and signals supplied from pixels P of even-numbered rows and even-numbered columns are read, the switch SW_SMPLP of the DAC circuit CDACP is on, and the switch SW_SMPLN of the DAC circuit CDACN is off. Accordingly, the video signals VSIG output from the pixels P(G) of odd-numbered rows and the pixels P(G) of even-numbered rows are input to the DAC circuit CDACP. On the other hand, when signals supplied from pixels P of odd-numbered rows and even-numbered columns and signals supplied from pixels P of even-numbered rows and odd-numbered columns are read, the switch SW_SMPLP of the DAC circuit CDACP is off and the switch SW_SMPLN of the DAC circuit CDACN is on. Accordingly, the video signals VSIG output from the pixels P(R) of odd-numbered rows and the pixels P(B) of even-numbered rows are input to the DAC circuit CDACN.

In the image sensor IMGc, the video signals VSIG output from the pixels P(G) are sampled by the DAC circuit CDACP, and the video signals VSIG output from the pixels P(B) or the pixels P(R) are sampled by the DAC circuit CDACN. For this reason, similar to the image sensor IMGb, the image sensor IMGc can acquire an image having high image quality.

While preferred embodiments of the invention have been described and shown above, it should be understood that these are exemplars of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An analog to digital (AD) converter comprising:
   a first digital to analog converter (DAC) circuit including a plurality of first capacitors of which capacitance values are weighted;
   a second DAC circuit including a plurality of second capacitors of which capacitance values are weighted;
   a comparison circuit connected to a first output node of the first DAC circuit and a second output node of the second DAC circuit and configured to compare an electric potential of the first output node with an electric potential of the second output node; and
   a control circuit configured to control the first DAC circuit and the second DAC circuit in accordance with a result of the comparison acquired by the comparison circuit,
   wherein the first DAC circuit and the second DAC circuit are configured to perform a first operation and a second operation, the first DAC circuit performs the first operation in parallel with the second operation performed by the second DAC circuit, the first DAC circuit performs the second operation in parallel with the first operation performed by the second DAC circuit,
   the first DAC circuit and the second DAC circuit alternately perform the first operation and the second operation in parallel with each other,
   in the first operation of the first DAC circuit, input signal is applied to a first input node of the first DAC circuit, a first reference signal is applied to the first output node, first electric charge is conserved in the plurality of first capacitors on the basis of a difference between an electric potential of the input signal and an electric potential of the first reference signal, the electric potential of the first reference signal applied to the first output node is input to the comparison circuit as a first electric potential,
   in the first operation of the second DAC circuit, the input signal is applied to a second input node of the second DAC circuit, the first reference signal is applied to the second output node, second electric charge is conserved in the plurality of second capacitors on the basis of a difference between an electric potential of the input signal and an electric potential of the first reference signal, the electric potential of the first reference signal applied to the second output node is input to the comparison circuit as the first electric potential,
   in the second operation of the first DAC circuit, when a second reference signal is applied to the first input node and the first electric charge is conserved in the plurality of first capacitors, signals input to input nodes of the plurality of first capacitors are switched to the second reference signal or a ground level by the control circuit and a second electric potential is generated,
   in the second operation of the second DAC circuit, when the second reference signal is applied to the second input node and the second electric charge is conserved in the plurality of second capacitors, signals input to input nodes of the plurality of second capacitors are switched to the second reference signal or the ground level by the control circuit, and a third electric potential is generated, and
   the comparison circuit sequentially performs comparison operation of comparing the first electric potential with the second electric potential and comparison operation of comparing the first electric potential with the third electric potential, thereby performing AD conversion.

2. An image sensor comprising:
   the AD converter according to claim 1;
   a plurality of pixels disposed in a matrix pattern; and
   a plurality of column circuits, each column circuit included in the plurality of column circuits being disposed for each column of the plurality of pixels,
   wherein signals output from the column circuits disposed in odd-numbered columns of the plurality of pixels are input to one of the first DAC circuit and the second DAC circuit, and
   wherein signals output from the column circuits disposed in even-numbered columns of the plurality of pixels are input to a DAC circuit other than the DAC circuit to which the signals output from the column circuits disposed in the even-numbered columns are input.

3. An image sensor comprising:
   the AD converter according to claim 1; and
   a plurality of pixels disposed in a matrix pattern,
   wherein the plurality of pixels include a plurality of first pixels and a plurality of second pixels,
   each first pixel included in the plurality of first pixels includes a color filter of a first color,
   each second pixel included in the plurality of second pixels includes a color filter of a second color different from the first color,
   the plurality of first pixels and the plurality of second pixels are periodically arranged,
   signals output from the first pixels are input to one of the first DAC circuit and the second DAC circuit, and
   signals output from the second pixels are input to a DAC circuit other than the DAC circuit to which the signals output from the first pixels are input.

* * * * *